United States Patent
Yang

(10) Patent No.: US 10,403,650 B2
(45) Date of Patent: Sep. 3, 2019

(54) ELECTRONIC DEVICE AND MANUFACTURING METHOD THEREOF

(71) Applicant: GIO Optoelectronics Corp., Tainan (TW)

(72) Inventor: Wu-Chang Yang, Tainan (TW)

(73) Assignee: GIO OPTOELECTRONICS CORP., Tainan (TW)

( * ) Notice: Subject to any disclaimer, the term of this patent is extended or adjusted under 35 U.S.C. 154(b) by 0 days.

(21) Appl. No.: 15/973,854

(22) Filed: May 8, 2018

(65) Prior Publication Data

US 2018/0337196 A1    Nov. 22, 2018

(30) Foreign Application Priority Data

May 19, 2017 (CN) .......................... 2017 1 0357379

(51) Int. Cl.
*H01L 27/12* (2006.01)
*H01L 51/00* (2006.01)
(Continued)

(52) U.S. Cl.
CPC ............ *H01L 27/124* (2013.01); *H01L 24/16* (2013.01); *H01L 24/81* (2013.01); *H01L 25/167* (2013.01); *H01L 27/127* (2013.01); *H01L 27/1218* (2013.01); *H01L 27/1266* (2013.01); *H01L 27/307* (2013.01); *H01L 27/3276* (2013.01); *H01L 51/0097* (2013.01); *H01L 21/32133* (2013.01); *H01L 33/62* (2013.01); *H01L 2224/16145* (2013.01);
(Continued)

(58) Field of Classification Search
CPC combination set(s) only.
See application file for complete search history.

(56) References Cited

U.S. PATENT DOCUMENTS

| 5,084,211 A | * | 1/1992 | Kawaguchi | .............. C08K 3/04 252/511 |
| 2008/0199988 A1 | * | 8/2008 | Ito | ...................... H01L 21/4853 438/125 |

(Continued)

FOREIGN PATENT DOCUMENTS

| EP | 1 753 030 A2 | 2/2007 |
| JP | 2005035285 A | 2/2005 |

(Continued)

*Primary Examiner* — Mamadou L Diallo
(74) *Attorney, Agent, or Firm* — Muncy, Geissler, Olds & Lowe, P.C.

(57) ABSTRACT

An electronic device and a manufacturing method thereof are disclosed. The manufacturing method of an electronic device includes following steps: forming a flexible substrate on a rigid carrier plate; forming at least a thin-film device on the flexible substrate; forming a conductive line on the flexible substrate, wherein the conductive line is electrically connected with the thin-film device; forming at least an electrical connection pad on the flexible substrate, wherein the electrical connection pad is electrically connected with the conductive line, and the thickness of the electrical connection pad is between 2 and 20 microns; disposing at least a surface-mount device (SMD) on the flexible substrate, wherein the SMD is electrically connected with the thin-film device through the electrical connection pad and the conductive line; and removing the rigid carrier plate.

17 Claims, 7 Drawing Sheets

(51) Int. Cl.
*H01L 27/30* (2006.01)
*H01L 27/32* (2006.01)
*H01L 23/00* (2006.01)
*H01L 25/16* (2006.01)
*H01L 21/3213* (2006.01)
*H01L 33/62* (2010.01)

(52) U.S. Cl.
CPC ............. *H01L 2224/81005* (2013.01); *H01L 2227/326* (2013.01); *H01L 2251/5338* (2013.01); *H01L 2251/558* (2013.01); *H01L 2924/12041* (2013.01); *H01L 2924/13069* (2013.01); *H01L 2933/0066* (2013.01)

(56) References Cited

U.S. PATENT DOCUMENTS

| | | | |
|---|---|---|---|
| 2009/0183772 A1* | 7/2009 | Joo | H01L 21/02532 136/258 |
| 2012/0161197 A1 | 6/2012 | Im et al. | |
| 2012/0218219 A1 | 8/2012 | Rappoport et al. | |
| 2015/0311361 A1* | 10/2015 | Sogabe | H01L 31/022475 136/256 |
| 2016/0037107 A1 | 2/2016 | Sakaguchi | |
| 2016/0043153 A1 | 2/2016 | Min | |
| 2017/0086291 A1* | 3/2017 | Cotton | H01L 23/5387 |
| 2018/0145110 A1* | 5/2018 | Zhao | H01L 39/2416 |

FOREIGN PATENT DOCUMENTS

| | | |
|---|---|---|
| JP | 2005338179 A | 12/2005 |
| JP | 2006269615 A | 10/2006 |
| JP | 2008147328 A | 6/2008 |
| JP | 2008302514 A | 12/2008 |
| JP | 2014512556 A | 5/2014 |
| JP | 2015072361 A | 4/2015 |
| TW | 201322523 A | 6/2013 |
| TW | I485626 B | 5/2015 |
| WO | WO-2010125623 A1 | 11/2010 |

* cited by examiner

ELECTRONIC DEVICE AND MANUFACTURING METHOD THEREOF

CROSS REFERENCE TO RELATED APPLICATIONS

This Non-provisional application claims priority under 35 U.S.C. § 119(a) on Patent Application No(s). 201710357379.5 filed in People's Republic of China on May 19, 2017, the entire contents of which are hereby incorporated by reference.

BACKGROUND

Technology Field

The present disclosure relates to an electronic device and, in particular, to an electronic device and a manufacturing method thereof.

Description of Related Art

In the conventional manufacturing procedure of electronic device (e.g. display), the semiconductor manufacturing process is performed to obtain individual semiconductor devices, which are then transferred onto a carrier substrate. Afterwards, a pick-up head is enabled to grab one or more semiconductor devices and to transfer the grabbed semiconductor devices onto a circuit board for performing the following manufacturing processes. However, the above manufacturing process needs a relatively expensive equipment, so that the manufacturing cost for the electronic device becomes higher. Besides, the density of the electronic devices can be limited due to the production accuracy of the equipment.

SUMMARY

An objective of this disclosure is to provide an electronic device and a manufacturing method thereof that can achieve a higher component density for the electronic devices.

To achieve the above, the present disclosure provides an electronic device including a flexible circuit board, at least one thin-film device, and at least one surface-mount device (SMD). The flexible circuit board includes a flexible substrate, a conductive line and at least an electrical connection pad. The conductive line is disposed on the flexible substrate. The electrical connection pad is disposed on the flexible substrate and electrically connected with the conductive line. A thickness of the electrical connection pad is between 2 microns and 20 microns. The thin-film device is disposed on the flexible substrate and electrically connected with the conductive line. The SMD is disposed on the flexible substrate and is electrically connected with the thin-film device through the electrical connection pad and the conductive line.

To achieve the above, the disclosure also provides a manufacturing method of an electronic device, which includes steps of: forming a flexible substrate on a rigid carrier plate; forming at least a thin-film device on the flexible substrate; forming a conductive line on the flexible substrate, wherein the conductive line is electrically connected with the thin-film device; forming at least an electrical connection pad on the flexible substrate, wherein the electrical connection pad is electrically connected with the conductive line, and a thickness of the electrical connection pad is between 2 microns and 20 microns; disposing at least a surface-mount device (SMD) on the flexible substrate, wherein the SMD is electrically connected with the thin-film device through the electrical connection pad and the conductive line; and removing the rigid carrier plate.

In one embodiment, the flexible substrate comprises an organic polymer material, and a glass transition temperature of the organic polymer material is between 400° C. and 600° C.

In one embodiment, a width of the conductive line is between 1 microns and 10 microns.

In one embodiment, the thin-film device is a semiconductor device.

In one embodiment, the flexible substrate includes an active region and a periphery region, the thin-film device is located in the active region, and the SMD is located in the periphery region for driving the thin-film device.

In one embodiment, the electronic device includes a plurality of thin-film devices forming a sensing pixel array.

In one embodiment, the flexible substrate includes an active region, and the thin-film device and the SMD are located in the active region.

In one embodiment, the electronic device includes a plurality of thin-film devices and a plurality of SMDs, and the thin-film devices and the SMDs form a sensing pixel array.

In one embodiment, the thin-film device includes at least a thin-film transistor, and the SMD includes at least an LED chip.

In one embodiment, the electronic device is a fingerprint sensor, an X-ray sensor, or an LED display.

In one embodiment, the flexible substrate is disposed by gluing or dispensing and is then cured so as to be formed on the rigid carrier plate.

In one embodiment, the electrical connection pad is formed by a plating, printing, or evaporation process and a lift-off patterning process.

In one embodiment, the conductive line is formed by a copper foil pressing process and an etching process or by a thin film process.

In one embodiment, the thin film process includes a low-temperature polycrystalline silicon process, an amorphous silicon process, or a metal oxide semiconductor process.

As mentioned above, in the electronic device and the manufacturing method thereof of this disclosure, a conductive line and at least one electrical connection pad are formed on a flexible substrate, at least one thin-film device is disposed on the flexible substrate and electrically connected with the conductive line and the electrical connection pad, and an SMD is disposed on the flexible substrate and electrically connected with the thin-film device through the conductive line and the electrical connection pad. The thickness of the electrical connection pad is between 2 microns and 20 microns. Compared with the conventional electronic device, the thin-film device of the electronic device of this disclosure is formed by a thin-film process, and then the SMD is disposed by a surface-mount technology (SMT). Accordingly, it is possible to manufacture many fine layouts and components, thereby increasing the component density.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
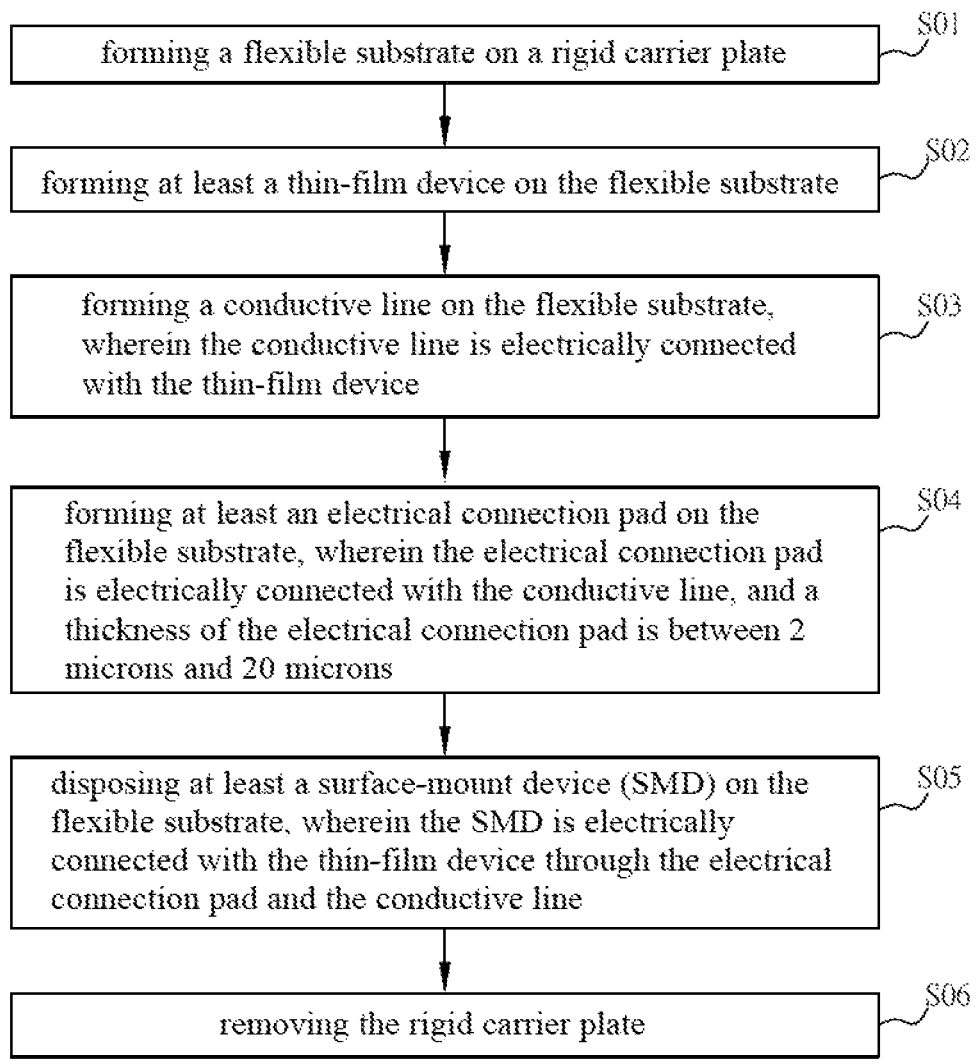
FIG. 1 is a flow chart of a manufacturing method of an electronic device according to an embodiment of the disclosure.

FIG. 1 is a flow chart of a manufacturing method of an electronic device according to an embodiment of the disclosure. The "electronic device" in the following embodiments can be an LED display, a micro-LED display, a sensing device (e.g. fingerprint sensor, fingerprint reader, or an X-ray sensor), a semiconductor device, or an illumination device, and this disclosure is not limited thereto.

As shown in FIG. 1, the manufacturing method of the electronic device 1 includes the following steps of: forming a flexible substrate on a rigid carrier plate (step S01); forming at least a thin-film device on the flexible substrate (step S02); forming a conductive line on the flexible substrate, wherein the conductive line is electrically connected with the thin-film device (step S03); forming at least an electrical connection pad on the flexible substrate, wherein the electrical connection pad is electrically connected with the conductive line, and a thickness of the electrical connection pad is between 2 microns and 20 microns (step S04); disposing at least a surface-mount device (SMD) on the flexible substrate, wherein the SMD is electrically connected with the thin-film device through the electrical connection pad and the conductive line (step S05); and removing the rigid carrier plate (step S06).

The details of the steps S01 to S06 will be described with reference to FIG. 1 in view of FIGS. 2A to 2E. FIGS. 2A to 2E are schematic diagrams showing the manufacturing procedures of the electronic device 1 according to an embodiment of the disclosure.

Figure 2A:
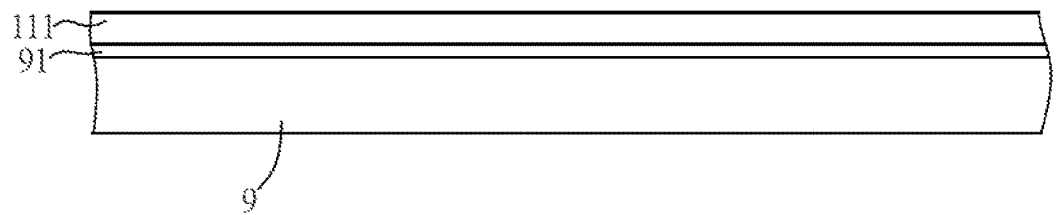
FIGS. 2A to 2E are schematic diagrams showing the manufacturing procedures of the electronic device according to an embodiment of the disclosure.

As shown in FIG. 2A, the step S01 is to form a flexible substrate 111 on a rigid carrier plate 9. The rigid carrier plate 9 can be made of a transparent or non-transparent material such as, for example but not limited to, a glass plate, a ceramic plate, a metal plate, or a quartz plate. In this embodiment, the rigid carrier plate 9 is a glass plate. In addition, the flexible substrate 111 is flexible and includes organic polymer material, and a glass transition temperature (Tg) of the organic polymer material is between 400° C. and 600° C. Since the organic polymer material has a relative higher glass transition temperature, the characteristics of the flexible substrate 111 can be maintained in the following manufacturing processes. The organic polymer material can be a thermal solidification material, such as polyimide (PI), polyethylene (PE), polyvinylchloride (PVC), polystyrene (PS), acrylic, fluoropolymer, polyester, or nylon. In this embodiment, the material of the flexible substrate 111 is polyimide (PI).

The material of the flexible substrate 111 is disposed on the rigid carrier plate 9 by gluing or dispensing, and then cured (by thermal solidification or light curing) to form the flexible substrate 111 on the rigid carrier plate 9. In this embodiment, an adhesive layer 91 is applied on the rigid carrier plate 9, and then the flexible substrate 111 is attached on the adhesive layer 91. After the following laminating process and curing process, the flexible substrate 111 can be formed on the rigid carrier plate 9. The material of the adhesive layer 91 can be, for example but not limited to, epoxy or silane coupling agent (SCA). Alternatively, if flexible substrate 111 can also be formed by dispensing. In practice, the organic polymer material is applied on the rigid carrier plate 9. After curing the organic polymer material, a layer of flexible substrate 111 can be formed on the rigid carrier plate 9. In this case, the adhesive layer is not needed.

Figure 2B:
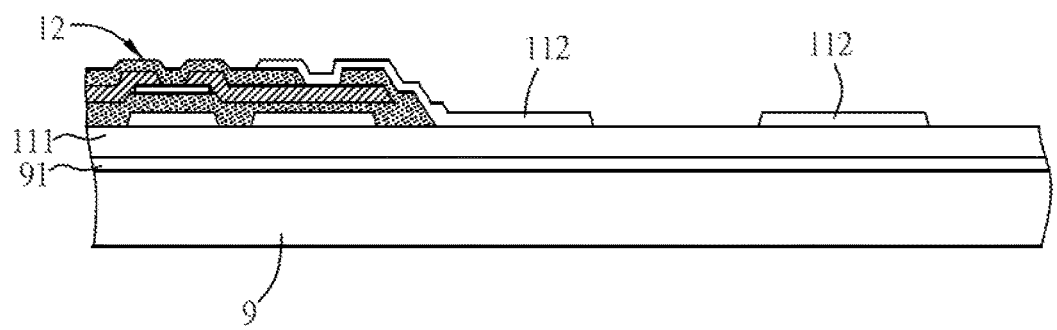

As shown in FIG. 2B, the step S02 is to form at least a thin-film device 12 on the flexible substrate 111 by a thin-film process. In this step, the thin-film process can be a semiconductor process, and the thin-film device 12 is a semiconductor device, which is directly formed and disposed on the flexible substrate 111. Alternatively, the thin-film device 12 can be indirectly formed on the flexible substrate 111. For example, a buffer layer or an insulation layer can be formed between the thin-film device 12 and the flexible substrate 111, and this disclosure is not limited. In some embodiments, the thin-film device 12 can be, for example but not limited to, a TFT transistor, a photo transistor, a diode, an LED, a μLED, an OLED, a photo diode, a capacitor, a voltage controlled capacitor, a resistor, a photo resistor, a thermal resistor, or any combination thereof. In addition, the thin-film process can include a low-temperature polycrystalline silicon (LTPS) process, an amorphous silicon (a-Si) process, or a metal oxide semiconductor process (e.g. IGZO), and this disclosure is not limited thereto. In some embodiments, another layer (e.g. the insulation layer or a conductive layer) can also be formed on the flexible substrate 111.

Next, the step S03 is to form a conductive line 112 on the flexible substrate 111. Herein, the conductive line 112 is electrically connected with the thin-film device 12, and a width of the conductive line 112 is between 1 microns and 10 microns. The conductive line 112 can be a single-layer structure or a multilayer structure made of a metal material (e.g. aluminum, copper, silver, molybdenum, or titanium) or an alloy. Moreover, the conductive line 112 can be formed by a copper foil pressing process and an etching process, or it can be formed by a thin film process, so that the conductive line 112 and the thin-film device 12 can be formed by the same thin film process. This disclosure is not limited. In this embodiment, the conductive line 112 and the conductive layer of the thin film device 12 can be formed by the same process or the same material. In some embodiments, the conductive line 112 can be directly electrically connected with the thin-film device 12, or the conductive line 112 can be electrically connected with the thin-film device 12 via another conductive layer. Alternatively, the conductive line 112 can be configured to electrically connect two thin-film devices 12. This disclosure is not limited. In this embodiment, two conductive lines 112 are formed on the flexible substrate 111, and one of the conductive lines 112 is electrically connected with the thin-film device 12.

Figure 2C:
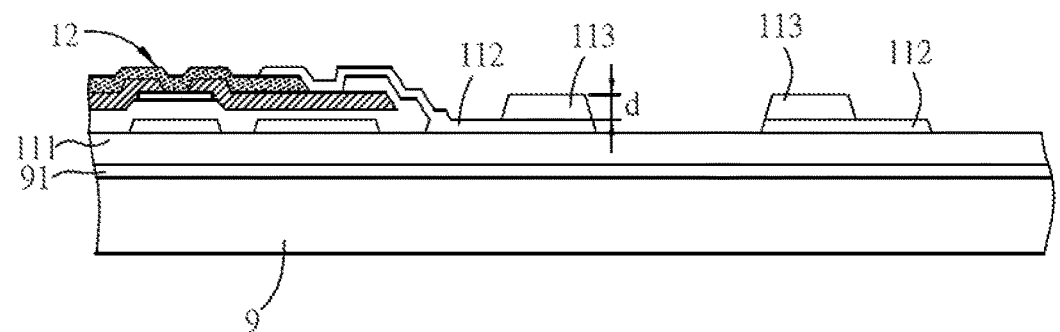

As shown in FIG. 2C, the step S04 is to form at least an electrical connection pad 113 on the flexible substrate 111.

The electrical connection pad 113 is electrically connected with the conductive line 112. In this embodiment, two electrical connection pads 113 are configured corresponding to the two conductive lines 112, respectively, and the electrical connection pads 113 are electrically connected to the conductive lines 112, respectively. The material of the electrical connection pads 113 can be, for example but not limited to, copper, silver, gold, or any combination thereof.

In order to easily bond and connect the SMD 13 and the electrical connection pad 113, the thickness d of the electrical connection pad 113 must be thinker such as between 2 microns and 20 microns. For manufacturing the thicker electrical connection pad 113, in some embodiments, the electrical connection pad 113 can be formed on the conductive line 112 by a plating, printing, or evaporation process and a lift-off patterning process. In some embodiments, the electrical connection pad 113 can be formed by the thin-film process. The conductive line 112 and the electrical connection pad 113 can be different layers or the same layer during the manufacturing process. This disclosure is not limited. In addition, the step S04 for forming the electrical connection pad 113 and the step S02 for forming the thin-film device 12 can be changed. In other words, the step S04 for forming the electrical connection pad 113 can be earlier than the step S02 for forming the thin-film device 12, and this disclosure is not limited.

Figure 2D:
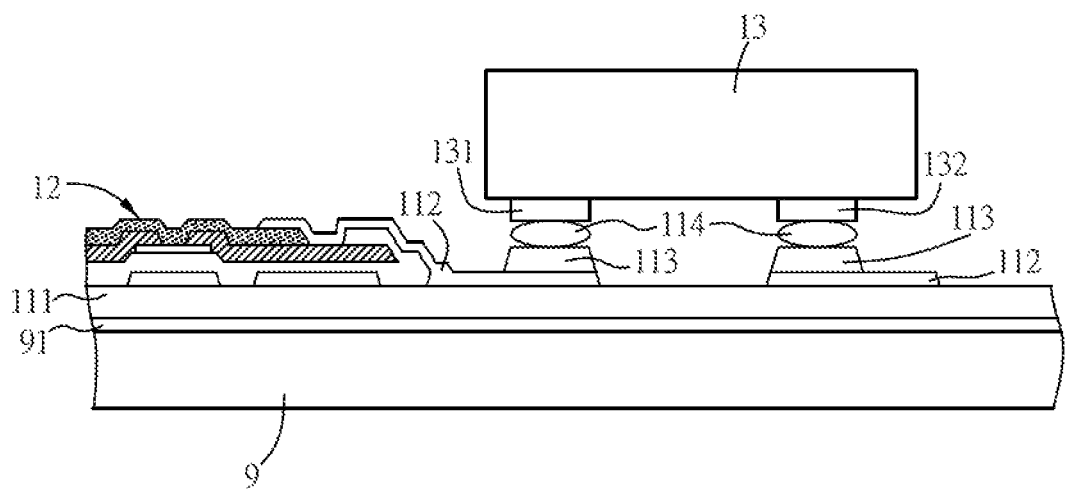

As shown in FIG. 2D, in order to connect the SMD 13 and the electrical connection pad 113, a conductive member 114 must be disposed on the electrical connection pad 113 before the step S05 for disposing the SMD 13. In this embodiment, the material of the conductive member 114 can be, for example but not limited to, a solder or an adhesive material. The adhesive material can be optionally selected according to the connecting method. For example, when the SMD 13 is bonded by the light curing method (e.g. UV light), the adhesive material can be an UV glue. When the SMD 13 is bonded by the thermal solidification method, the adhesive material can be a thermal solidification adhesive material such as a film type adhesive material (e.g. anisotropic conductive film (ACF)), or anisotropic conductive paste (ACP).

Afterwards, the step S05 is performed to dispose at least a surface-mount device (SMD) 13 on the flexible substrate 111. In this embodiment, the SMD 13 is electrically connected with the thin-film device 12 through the electrical connection pad 113 and the conductive line 112. Herein, the SMD 13 is disposed on the conductive member 114 by the surface-mount technology (SMT), so that the SMD 13 can be electrically connected with the electrical connection pad 113 through the conductive member 114. The SMD 13 is, for example but not limited to, a two-electrode device such as, for example but not limited to, an LED, a μLED, a photo diode, or an image sensor. Of course, the SMD 13 can also be a three-electrode device (e.g. transistor), an IC (e.g. CPU), an active component, a passive component, a connector, or an SMD with another function, and this disclosure is not limited thereto. The SMD 13 of this disclosure includes two LED 131 and 132, which have two electrodes. In some embodiments, the conductive member 114 is made of a solder material, which can be fused by heat. Thus, the electrode 131 of the SMD 13 can be electrically connected with the thin-film device 12 through the conductive member 114, the electrical connection pad 113, and the conductive line 112. In addition, another electrode 132 of the SMD 13 can be electrically connected with another conductive line 112 through another conductive member 114 and another electrical connection pad 113. For example, the another conductive line 112 can be connected to a ground terminal, a power source terminal, or another thin-film device. In this embodiment, the SMD 13 is disposed on the flexible substrate 111 by SMT, so that the convention chip transferring process is not needed. As a result, the manufacturing process of this disclosure is simpler and cheaper.

Figure 2E:
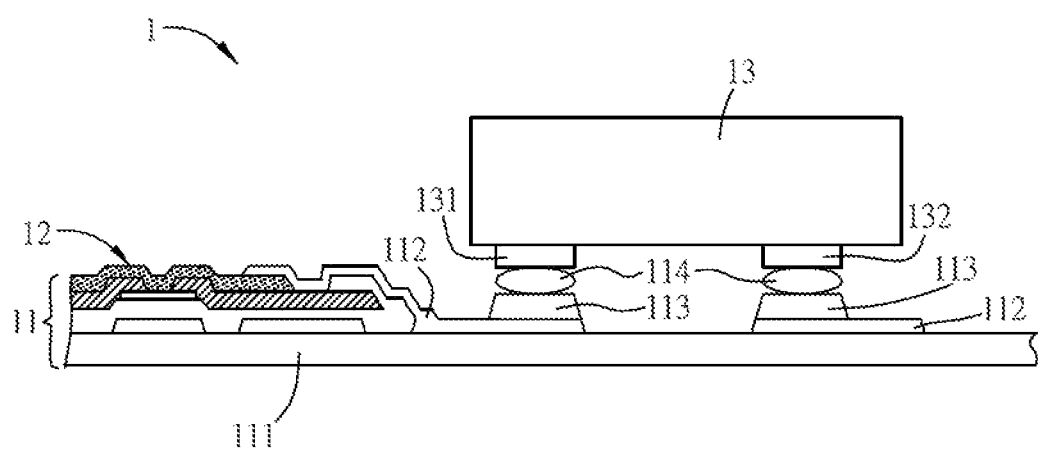

Finally, as shown in FIG. 2E, the step S06 is to remove the rigid carrier plate 9. In this step, the rigid carrier plate 9 can be removed by laser lift-off or machine lift-off. Afterwards, the adhesive layer 91 is also removed so as to obtain the SOF (system on film) electronic device 1.

In this embodiment, the electronic device 1 includes a flexible circuit board 11, at least one thin-film device 12, and at least one SMD 13. The conductive line 112 is disposed on the flexible substrate 111. The electrical connection pad 113 is disposed on the flexible substrate 111 and electrically connected with the conductive line 112. A thickness of the electrical connection pad 113 is between 2 microns and 20 microns. The thin-film device 12 is disposed on the flexible substrate 111 and electrically connected with the conductive line 112. The SMD 13 is disposed on the flexible substrate 111 and is electrically connected with the thin-film device 12 through the electrical connection pad 113 and the conductive line 112. The thin-film device 12 and the conductive line 112 are formed on the flexible substrate 111 by the thin-film process, and the SMD 13 is disposed by SMT and electrically connected with the thin-film device 12 through the electrical connection pad 113 and the conductive line 112. Accordingly, it is possible to manufacture many fine layouts and components, thereby increasing the component density of the electronic device 1.

Figure 3:
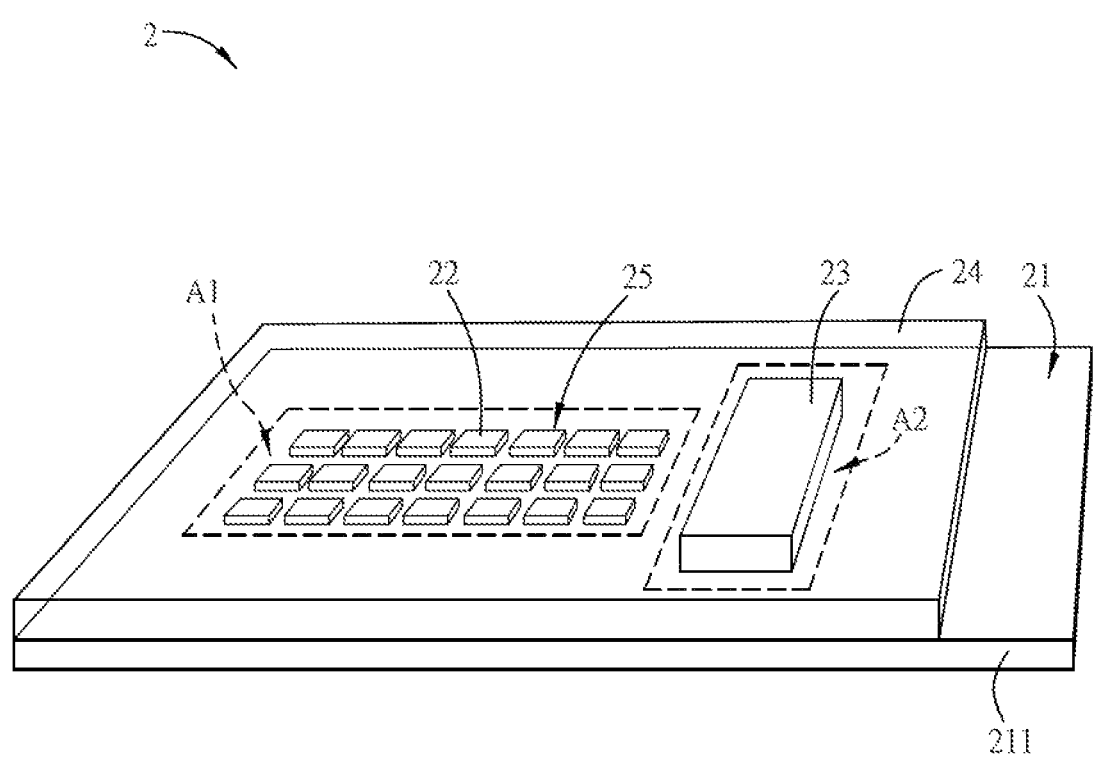
FIG. 3 is a schematic diagram showing an electronic device according to another embodiment of the disclosure.

FIG. 3 is a schematic diagram showing an electronic device 2 according to another embodiment of the disclosure. The electronic device 2 can be a fingerprint sensor or an X-ray sensor. In this embodiment, the electronic device 2 is a fingerprint sensor and is fabricated by the above-mentioned manufacturing method.

In this embodiment, the electronic device 2 includes a flexible circuit board 21, a plurality of thin-film devices 22, and at least one SMD 23. The SMD 23 is disposed on the flexible substrate 211 and electrically connected with the thin-film devices 22 (the conductive line and electrical connection pad are not shown). In this embodiment, the flexible substrate 211 of the flexible circuit board 21 includes an active region A1 and a periphery region A2. The thin-film devices 22 are located in the active region A1, and the SMD 23 is located in the periphery region A2 for driving the thin-film devices 22. The region of the flexible substrate 211 other than the active region A1 is defined as the periphery region A2. In other embodiments, the thin-film devices 22 can be located in the periphery region A2, and the SMD 23 is located in the active region A1. The thin-film devices 22 are configured to drive the SMD 23. This disclosure is not limited. In addition, a protection layer 24 can be provided to cover the thin-film devices 22 and the SMD 23 for preventing the contamination and damage of the thin-film devices 22 or the SMD 23.

In this embodiment, the thin-film devices 22 are fingerprint identical devices, which can form a sensing pixel array 25 (fingerprint sensing pixel array). In addition, the SMD 23 is configured to drive the sensing pixel array 25 within the active region A1. When a finger presses or is positioned on the protection layer 24 over the sensing pixel array 25 (the active region A1), the sensing pixel array 25 and the SMD 23 can detect and identify the fingerprint.

Figure 4A:
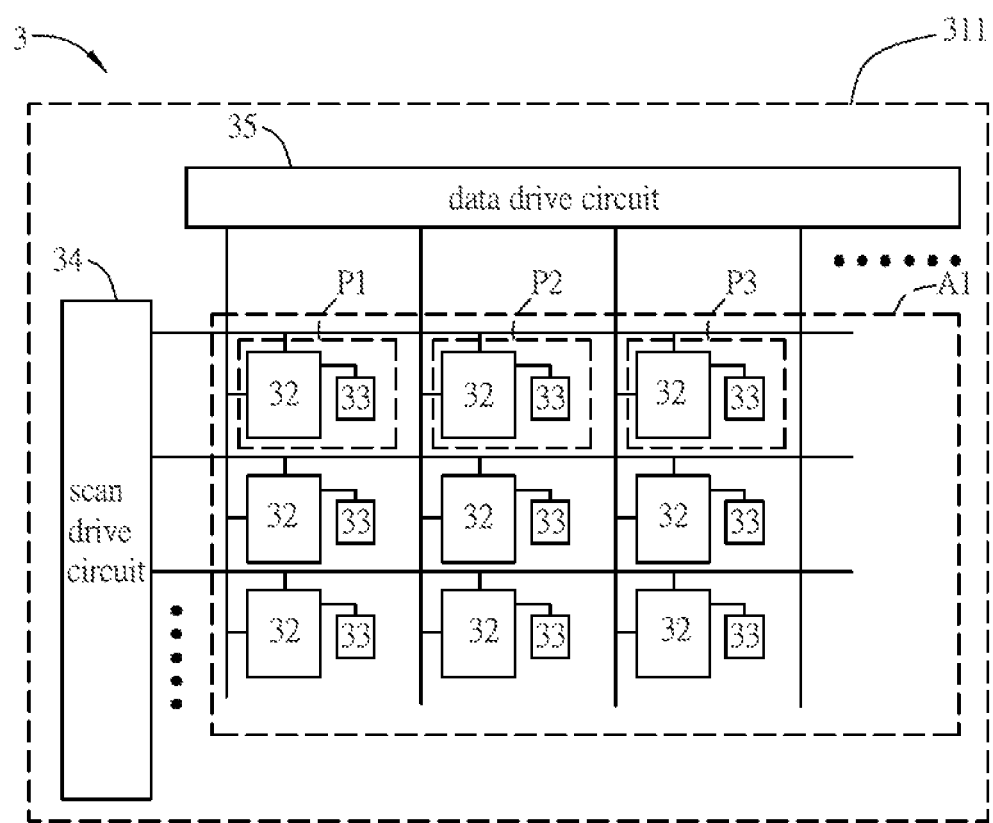
FIG. 4A is a schematic diagram showing an electronic device according to another embodiment of the disclosure.

FIG. 4A is a schematic diagram showing an electronic device 3 according to another embodiment of the disclosure.

In this embodiment, the electronic device 3 is an active matrix LED display device, which can be fabricated by the above-mentioned manufacturing method.

In this embodiment, the electronic device 3 includes a flexible circuit board (not shown), a plurality of thin-film devices 32, and a plurality of SMDs 33. The thin-film devices 32 and the SMDs 33 are disposed on the flexible substrate 311 and electrically connected with each other (the conductive line and electrical connection pad are not shown). In addition, the electronic device 3 further includes a scan drive circuit 34, a data drive circuit 35, a plurality of scan lines, and a plurality of data lines. The data lines and scan lines are disposed on the flexible substrate 311. The scan drive circuit 34 is electrically connected with the thin-film devices 32 through the scan lines, and the data drive circuit 35 is electrically connected with the thin-film devices 32 through the data lines. The scan drive circuit 34 or the data drive circuit 35 can include at least one IC chip, which can be disposed on the flexible substrate 311 by flip-chip technology (e.g. COF). Alternatively, the scan drive circuit 34 or the data drive circuit 35 can be directly formed on the flexible substrate 311 by the thin-film process. This disclosure is not limited.

In this embodiment, the flexible circuit board, the thin-film devices 32, the SMDs 33, the scan lines, and the data lines form an active matrix circuit. The thin-film devices 32 include at least one thin-film transistor, and the SMDs 33 include at least one LED chip or μLED chip. The flexible substrate 311 has an active region A1, and the thin-film devices 32 and the SMDs 33 are located within the active region A1 to form a display pixel array. In this case, each pixel includes one thin-film device 32 and one SMD 33. In other words, the LED chip (or μLED chip) of each SMD 33 can have different designs. For example, each SMD 33 can be configured with a single LED chip (or μLED chip) or several LED chips of different colors (e.g. R, G and B LED chips or μLED chips). In addition, each SMD 33 can also be configured with four chips with three colors (e.g. RRGB, or WRGB). This disclosure is not limited.

Figure 4B:
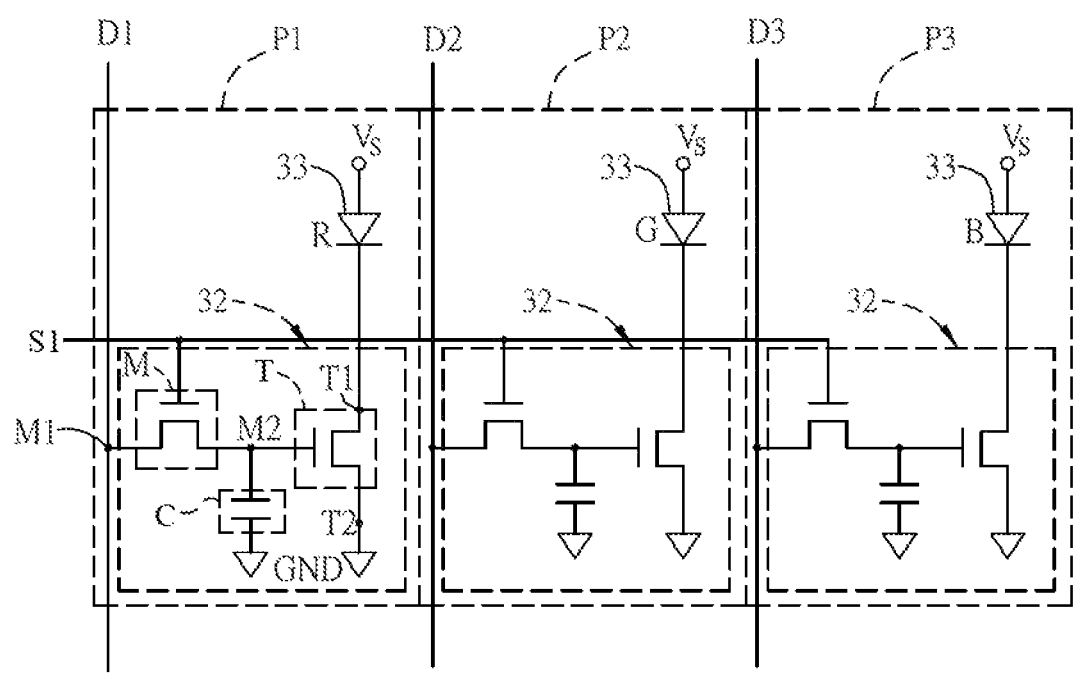
FIG. 4B is a schematic diagram showing the circuit of an electronic device according to an embodiment of the disclosure.

FIG. 4B is a schematic diagram showing the circuit of three adjacent pixels P1~P3 in an electronic device 3 according to an embodiment of the disclosure.

In the embodiment as shown in FIG. 4B, each SMD 33 includes an LED chip of one color. In this case, the SMD 33 of the pixel P1 is a red LED chip (R), the SMD 33 of the pixel P2 is a green LED chip (G), and the SMD 33 of the pixel P3 is a blue LED chip (B). Moreover, one end of each LED chip (SMD 33) is connected to a power source $V_S$, and the other end thereof is connected to the thin-film device 32.

In each pixel (e.g. the pixel P1), the thin-film 32 is electrically connected to one scan line S1, one data line D1, and one SMD 33 (LED chip). To be noted, the LED chip of this embodiment is an inorganic LED device, which is different from the LED manufactured by the conventional thin-film process. The LED chip is tested product and disposed on the flexible substrate 31 by SMT. Accordingly, the shape or size of the LED chip can be designed as the requirement of the user. Besides, the finished electronic devices 3 can have a lower production cost and a higher production yield than the display devices manufactured by the conventional thin-film process.

In the pixels P1, P2 and P3, the data lines D1, D2 and D3 can receive a data signal, respectively, for individually controlling the corresponding SMDs 33 (LED chips). In other embodiments, one thin-film device 32 can control a plurality of SMDs 33. In addition, the thin-film device 32 of each of the pixels P1, P2 and P3 includes at least one switch transistor M, a driving transistor T, and a capacitor C. In this embodiment, the thin-film device 32 has a 2T1C structure. Of course, the thin-film device 32 can have another circuit structure, such as a 4T2C or 5T1C structure. The circuit structure of the pixel P1 will be described hereinafter for an example.

In the pixel P1, the gate of the switch transistor M is connected to the scan line S1, the first terminal M1 of the switch transistor M is connected to the data line D1, which is connected to the pixel P1, and the second terminal M2 of the switch transistor M is connected to the gate of the driving transistor T and one terminal of the capacitor C. In addition, the first terminal T1 of the driving transistor T is connected to the LED chip (R), which is electrically connected to the pixel P1, and the second terminal T2 of the driving transistor T and the second terminal of the capacitor C are grounded. In this embodiment, the thin-film device 32 is a current control circuit of the LED chip. When the scan line S1 is driven and conducted, the data line D1 can transmit a data signal for controlling the luminance of the LED chip (R), which is connected to the first terminal T1 of the driving transistor T. Similarly, the data line D2 can transmit another data signal for controlling the luminance of the LED chip (G), and the data line D3 can transmit another data signal for controlling the luminance of the LED chip (B). In this embodiment, the data signal can be an analog signal or a digital signal.

In addition, if the LED chips of the above-mentioned electronic device 3 are LEDs for emitting a single color (e.g. blue light), the manufactured electronic device 3 will be a monochrome display panel.

In the electronic device 3 of this embodiment, when the scan lines are individually conducted, the thin-film devices 32 can receive the data signals from the data lines, respectively, so as to control the luminance statuses of LED chips of the SMDs 33. In practice, the thin-film devices 32 can control the luminance statuses of LED chips of the SMDs 33 by controlling the duty cycles or current values of the SMDs 33. In other words, the thin-film devices 32 can control the luminance statuses of LED chips of the SMDs 33 by controlling the conducting time or conducting current of the LED chips of the SMDs 33.

Regarding the conventional passive matrix LED display device, the driving method of the LEDs makes the lighting time become shorter, so the effective luminance is lower and the instantaneous current is higher. Accordingly, the requirement for the frequency of the scan signals is more critical. In order to achieve a higher luminance, the size of the LEDs as well as the entire display device will be larger. On the contrary, the electronic device 3 of this embodiment is an active matrix LED display device. The thin-film devices 32 and the SMDs 33 are disposed on the flexible substrate 311, and the SMDs 33 are electrically connected with the thin-film devices 32 through the electrical connection pads and conductive lines (not shown). Accordingly, the smaller driving current can achieve the same luminance, and the size of the LED chips can be smaller. Thus, the size and manufacturing cost of the electronic device 3 are lower, but the electronic device 3 still has a higher product reliability.

Figure 5A:
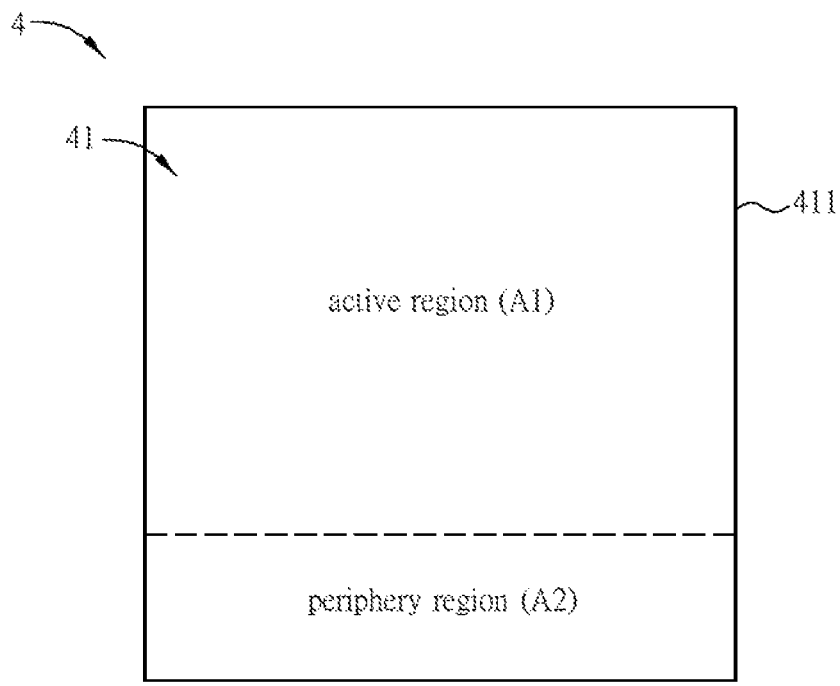
FIG. 5A is a top view of an electronic device according to another embodiment of the disclosure.
Figure 5B:
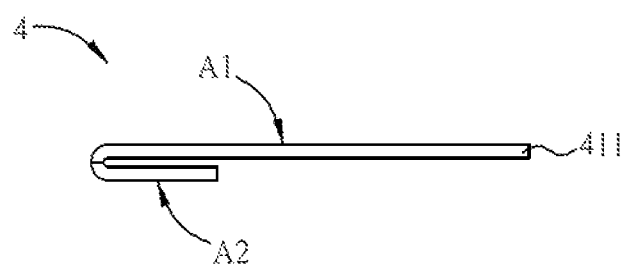
FIG. 5B is a side view of the electronic device of FIG. 5A.

FIG. 5A is a top view of an electronic device 4 according to another embodiment of the disclosure, and FIG. 5B is a side view of the electronic device 4 of FIG. 5A.

As shown in FIG. 5A, the electronic device 4 includes a flexible circuit board 41, at least one thin-film device, and at least one SMD. The thin-film device is disposed on the active region A1 of the flexible substrate 411, and the SMD is disposed on the periphery region A2 of the flexible substrate 411 and electrically connected to the thin-film device through the electrical connection pad and conductive line. To be noted, the thin-film device, SMD, conductive line and electrical connection pad are not shown in FIG. 5A.

In this embodiment, the electronic device 4 includes a plurality of thin-film devices, which form a pixel array. For example, the thin-film devices can be μLEDs or OLEDs, and are formed on the active region A1 by, for example but not limited to, the LTPS thin-film process. Thus, the electronic device 4 will be a μLED display device or an OLED display device. In addition, the periphery region A2 is configured with a driving circuit for driving the thin-film devices in the active region A1. The driving circuit can include a plurality of SMDs, which include ICs (e.g. CPU), other components, conductive lines or circuits. Besides, the SMDs of the periphery region A2 can also be formed by, for example but not limited to, the LTPS thin-film process.

In one embodiment, as shown in FIG. 5B, the periphery region A2 can be bent to the side below the flexible substrate 411, so that the vertical projections of the periphery region A2 and the active region A1 on the flexible substrate 411 are partially overlapped. To be noted, it is possible to half-cut the dotted line of FIG. 5A before the bending step.

In the conventional display device, a flexible board (e.g. COF) is provided to connect a printed circuit board and a display panel, so that the driving circuit disposed on the printed circuit board can be electrically connected to the display panel through the flexible board for driving the display panel. In the assembling procedure of the conventional display device, since the flexible board between the printed circuit board and the display panel is bendable, it is commonly to bend the flexible board for placing the printed circuit board below the display panel. This bending step can make the size of the conventional display device be smaller, but will increase the thickness thereof.

In the electronic device 4 of the embodiment as shown in FIG. 5B, the thin-film device is formed on the active region A1 by the thin-film process, and the SMD is disposed on the periphery region A2 by SMT. Since the thin-film devices, SMDs, conductive lines and electrical connection pads are disposed on the same surface of the flexible substrate 411, many fine layouts and components can be formed on the flexible substrate 411, the manufacturing processes are easier and simpler, and the manufacturing cost is lower. In addition, since the flexible substrate 411 can be directly bent, the driving circuit on the periphery region A2 can be positioned under the active region A1. Compared with the conventional process, the electronic device 4 of this embodiment can be manufactured thinner.

To sum up, in the electronic device and the manufacturing method thereof of this disclosure, a conductive line and at least one electrical connection pad are formed on a flexible substrate, at least one thin-film device is disposed on the flexible substrate and electrically connected with the conductive line and the electrical connection pad, and an SMD is disposed on the flexible substrate and electrically connected with the thin-film device through the conductive line and the electrical connection pad. The thickness of the electrical connection pad is between 2 microns and 20 microns. Compared with the conventional electronic device, the thin-film device of the electronic device of this disclosure is formed by a thin-film process, and then the SMD is disposed by a surface-mount technology (SMT). Accordingly, it is possible to manufacture many fine layouts and components, thereby increasing the component density.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
a flexible circuit board, comprising:
a flexible substrate,
a conductive line disposed on the flexible substrate, and
at least an electrical connection pad disposed on the flexible substrate and electrically connected with the conductive line, wherein a thickness of the electrical connection pad is between 2 microns and 20 microns;
at least a thin-film device formed on the flexible substrate and electrically connected with the conductive line; and
at least a surface-mount device (SMD) directly mounted on the flexible substrate, wherein the SMD is electrically connected with the thin-film device through the electrical connection pad and the conductive line.

2. The electronic device according to claim 1, wherein the flexible substrate comprises an organic polymer material, and a glass transition temperature of the organic polymer material is between 400° C. and 600° C.

3. The electronic device according to claim 1, wherein a width of the conductive line is between 1 microns and 10 microns.

4. The electronic device according to claim 1, wherein the thin-film device is a semiconductor device.

5. The electronic device according to claim 1, wherein the flexible substrate comprises an active region and a periphery region, the thin-film device is located in the active region, and the SMD is located in the periphery region for driving the thin-film device.

6. The electronic device according to claim 5, wherein the electronic device comprises a plurality of thin-film devices forming a sensing pixel array.

7. The electronic device according to claim 1, wherein the flexible substrate comprises an active region, and the thin-film device and the SMD are located in the active region.

8. The electronic device according to claim 7, wherein the electronic device comprises a plurality of thin-film devices and a plurality of SMDs, and the thin-film devices and the SMDs form a sensing pixel array.

9. The electronic device according to claim 8, wherein the thin-film device comprises at least a thin-film transistor, and the SMD comprises at least an LED chip.

10. A manufacturing method of an electronic device, comprising steps of:
forming a flexible substrate on a rigid carrier plate;
forming at least a thin-film device on the flexible substrate;
forming a conductive line on the flexible substrate, wherein the conductive line is electrically connected with the thin-film device;
forming at least an electrical connection pad on the flexible substrate, wherein the electrical connection pad is electrically connected with the conductive line, and a thickness of the electrical connection pad is between 2 microns and 20 microns;
directly mounting at least a surface-mount device (SMD) on the flexible substrate by surface-mount technology, wherein the SMD is electrically connected with the thin-film device through the electrical connection pad and the conductive line; and removing the rigid carrier plate.

11. The manufacturing method according to claim 10, wherein the flexible substrate comprises an organic polymer material, and a glass transition temperature of the organic polymer material is between 400° C. and 600° C.

12. The manufacturing method according to claim 10, wherein the flexible substrate is disposed by gluing or dispensing and is then cured so as to be formed on the rigid carrier plate.

13. The manufacturing method according to claim 10, wherein the electrical connection pad is formed by a plating, printing, or evaporation process and a lift-off patterning process.

14. The manufacturing method according to claim 10, wherein the conductive line is formed by a copper foil pressing process and an etching process or by a thin film process.

15. The manufacturing method according to claim 14, wherein the thin film process comprises a low-temperature polycrystalline silicon process, an amorphous silicon process, or a metal oxide semiconductor process.

16. An electronic device, comprising:
a flexible circuit board, comprising:
a flexible substrate,
a conductive line disposed on the flexible substrate, and
at least an electrical connection pad disposed on the flexible substrate and electrically connected with the conductive line, wherein a thickness of the electrical connection pad is between 2 microns and 20 microns;
at least a thin-film device disposed on the flexible substrate and electrically connected with the conductive line; and
at least a surface-mount device (SMD) disposed on the flexible substrate, wherein the SMD is electrically connected with the thin-film device through the electrical connection pad and the conductive line;
wherein the flexible substrate comprises an active region and a periphery region, the thin-film device is located in the active region, and the SMD is located in the periphery region for driving the thin-film device.

17. The electronic device according to claim 16, wherein the electronic device comprises a plurality of thin-film devices forming a sensing pixel array.

\* \* \* \* \*